United States Patent
Chen et al.

(10) Patent No.: US 8,217,470 B2
(45) Date of Patent: Jul. 10, 2012

(54) FIELD EFFECT DEVICE INCLUDING RECESSED AND ALIGNED GERMANIUM CONTAINING CHANNEL

(75) Inventors: Xiangdong Chen, Poughquag, NY (US); Brian J. Greene, Hopewell Junction, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 12/702,682

(22) Filed: Feb. 9, 2010

(65) Prior Publication Data

US 2010/0200934 A1 Aug. 12, 2010

Related U.S. Application Data

(60) Provisional application No. 61/151,962, filed on Feb. 12, 2009.

(51) Int. Cl.
*H01L 29/78* (2006.01)
*H01L 21/336* (2006.01)
(52) U.S. Cl. .................................. 257/402; 438/307

(58) Field of Classification Search .............. 257/388, 257/402, 408; 438/300, 307, 424
See application file for complete search history.

(56) References Cited

U.S. PATENT DOCUMENTS

| | | | |
|---|---|---|---|
| 7,148,548 B2 | 12/2006 | Doczy et al. | |
| 7,208,361 B2 | 4/2007 | Shah et al. | |
| 7,297,587 B2 | 11/2007 | Wu et al. | |
| 7,332,407 B2 | 2/2008 | Wang et al. | |
| 7,812,370 B2 * | 10/2010 | Bhuwalka et al. | 257/192 |
| 2009/0026553 A1 * | 1/2009 | Bhuwalka et al. | 257/402 |
| 2009/0256206 A1 * | 10/2009 | Krivokapic | 257/354 |
| 2010/0044754 A1 * | 2/2010 | Boyanov et al. | 257/192 |

* cited by examiner

*Primary Examiner* — Fernando L Toledo
(74) *Attorney, Agent, or Firm* — Scully, Scott, Murphy & Presser, P.C.; Joseph P. Abate, Esq.

(57) ABSTRACT

A field effect structure and a method for fabricating the field effect structure include a germanium containing channel interposed between a plurality of source and drain regions. The germanium containing channel is coplanar with the plurality of source and drain regions, and the germanium containing channel includes a germanium containing material having a germanium content greater than the germanium content of the plurality of source and drain regions.

19 Claims, 5 Drawing Sheets

FIELD EFFECT DEVICE INCLUDING RECESSED AND ALIGNED GERMANIUM CONTAINING CHANNEL

This non-provisional application claims the benefit of the provisional application filed with the U.S. Patent and Trademark Office as Ser. No. 61/151,962 entitled "Field Effect Device Including Recessed And Aligned Germanium Containing Channel", filed Feb. 12, 2009.

BACKGROUND

1. Field of the Invention

The invention relates generally to field effect devices. More particularly, the invention relates to field effect devices with enhanced performance.

2. Description of the Related Art

Semiconductor structures generally include semiconductor devices such as but not limited to resistors, transistors, capacitors and diodes. The semiconductor devices are connected and interconnected with patterned conductor layers that are separated by dielectric layers. In turn, the patterned conductor layers and dielectric layers are also located and formed over a semiconductor substrate.

Of the foregoing semiconductor devices, transistors, and in particular field effect transistors are particularly common. Field effect transistors have been successfully scaled over the period of several decades to provide enhanced integration levels and enhanced performance levels of integrated circuits.

Of the more recent advances in field effect device technology is the use of generally high doelectric constant materials (i.e., having a dielectric constant greater than about 20) and metal gate (i.e., metal, metal alloy and metal nitride) gate materials. Generally high dielectric constant gate dielectric materials are desirable insofar as generally higher dielectric constant gate dielectric materials provide for thicker gate dielectrics which are readily manufacturable, while providing comparable performance in comparison with generally lower dielectric constant gate dielectric materials. Metal gate materials are desirable insofar as metal gate materials provide for an opportunity to engineer and tune a work function within a particular field effect device that uses a particular metal gate.

While field effect transistor devices are common and ubiquitous within semiconductor circuit fabrication, field effect transistor devices are nonetheless not entirely without problems.

In particular, it is often difficult to fabricate field effect transistor devices with enhanced performance within semiconductor circuits.

Since field effect transistors are likely to continue to be prevalent within the semiconductor fabrication art, desirable are field effect transistor devices and methods for fabricating the same that provide for enhanced field effect transistor device performance, in particular at decreased dimensions.

SUMMARY

The invention provides a field effect structure and a method for fabricating the field effect structure. Both the field effect structure and the related method include a germanium containing channel located aligned beneath a gate within a semiconductor substrate. The germanium containing channel is planar with a plurality of source and drain regions located and formed within the semiconductor substrate. The germanium containing channel includes a germanium containing semiconductor material having a higher germanium content than a semiconductor material from which is comprised the plurality of source and drain regions. The particular field effect structure provides value insofar as the germanium containing channel provides for enhanced performance in comparison with the otherwise equivalent field effect structure absent the germanium containing channel. More particularly, the germanium containing channel provides for a mobility enhancement for charge carriers within the germanium containing channel. The germanium containing channel also provides for a modulation of threshold voltage for a field effect device, such as a p metal oxide semiconductor field effect device.

A particular semiconductor structure including a field effect structure in accordance with the invention includes a semiconductor substrate. The particular semiconductor structure also includes a gate aligned over a channel within the semiconductor substrate. The particular semiconductor structure also includes a plurality of source and drain regions separated by the channel. Within the particular semiconductor structure: (1) the channel is coplanar with the plurality of source and drain regions; and (2) the channel includes a germanium containing material having a germanium content greater than a germanium content of the plurality of source and drain regions.

A particular method for fabricating a semiconductor structure including a field effect structure in accordance with the invention includes providing a semiconductor substrate. The particular method also includes forming a gate aligned over a channel within the semiconductor substrate. The particular method also includes forming a spacer adjoining the gate. The particular method also includes stripping the gate to leave remaining the spacer that exposes the semiconductor substrate. The particular method also includes etching the semiconductor substrate to form a recess within the semiconductor substrate aligned with the spacer. The particular method also includes forming a germanium containing channel layer within the recess. The particular method also includes forming a plurality of source and drain regions within the semiconductor substrate and separated by the channel, wherein: (1) the channel is coplanar with the plurality of source and drain regions; and (2) the germanium containing channel layer includes a germanium containing material having a germanium content greater than a germanium content of the plurality of source and drain regions.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein.

DESCRIPTION OF THE PREFERRED EMBODIMENT

The invention, which includes a semiconductor structure that includes a field effect structure, and a method for fabricating the semiconductor structure that includes the field effect structure, is understood within the context of the description set forth below. The description set forth below is understood within the context of the drawings described above. Since the drawings are intended for illustrative purposes, the drawings are not necessarily drawn to scale.

FIG. 1 to FIG. 9 show a series of schematic cross-sectional diagrams illustrating the results of progressive process steps in fabricating a semiconductor structure that includes a field effect structure in accordance with a particular embodiment of the invention. This particular embodiment of the invention comprises a sole embodiment of the invention.

Figure 1:
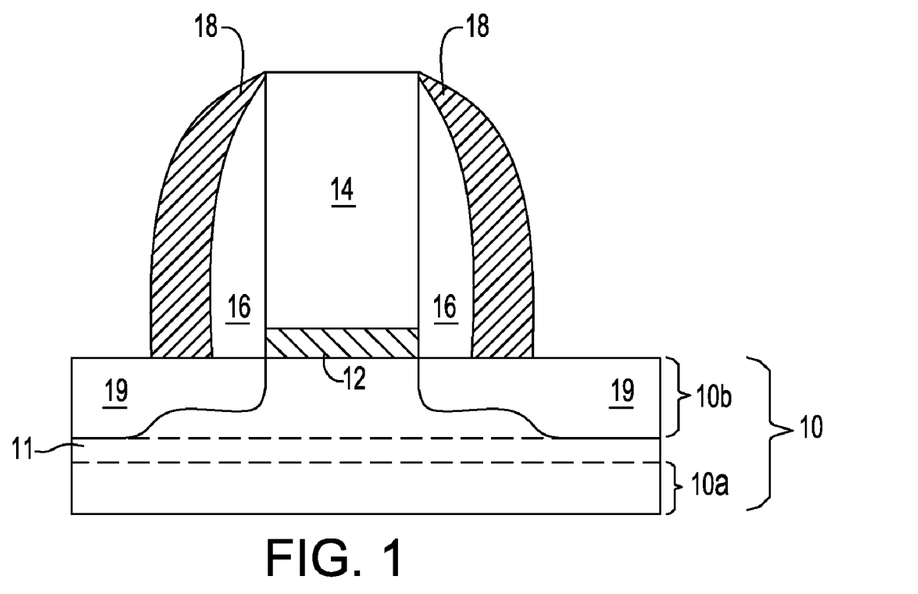
FIG. 1 to FIG. 9 show a series of schematic cross-sectional diagrams illustrating the results of progressive field effect structure fabrication (FIG. 1 and FIG. 2), gate and gate dielectric stripping (FIG. 3), recessed germanium containing channel formation (FIG. 4), replacement gate dielectric (FIG. 5), replacement gate (FIG. 6 and FIG. 7), dielectric backfill stripping (FIG. 8) and silicide formation (FIG. 9) process steps in accordance with a particular embodiment of the invention.

FIG. 1 shows a schematic cross-sectional diagram of the semiconductor structure at an early stage in the fabrication thereof in accordance with this particular embodiment that comprises the sole embodiment of the invention.

FIG. 1 shows a semiconductor substrate 10 that includes a base semiconductor substrate 10a separated from a surface semiconductor layer 10b by an optional buried dielectric layer 11. In an aggregate, the base semiconductor substrate 10a, the optional buried dielectric layer 11 and the surface semiconductor layer 10b comprise a semiconductor-on-insulator substrate.

The base semiconductor substrate 10a may comprise any of several semiconductor materials. Non-limiting examples include silicon, germanium, silicon-germanium alloy, silicon carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 10a has a generally conventional thickness.

The optional buried dielectric layer 11 may comprise any of several dielectric materials. Non-limiting examples include oxides, nitrides and oxynitrides, particularly of silicon, but oxides, nitrides and oxynitrides of other elements are not excluded. The optional buried dielectric layer 11 may comprise a crystalline or a non-crystalline dielectric material, with crystalline dielectrics being highly preferred. The optional buried dielectric layer 11 may be formed using any of several methods. Non-limiting examples include ion implantation methods, thermal or plasma oxidation or nitridation methods, chemical vapor deposition methods and physical vapor deposition methods. Typically, the optional buried dielectric layer 11 comprises an oxide of the semiconductor material from which is comprised the base semiconductor substrate 10. Typically, the optional buried dielectric layer 11 has a thickness from about 50 to about 200 nanometers.

The surface semiconductor layer 10b may comprise any of the several semiconductor materials from which the base semiconductor substrate 10b may be comprised within the context of further limitations discussed below within the context of a particular germanium content limitation. The surface semiconductor layer 10b and the base semiconductor substrate 10a may comprise either identical or different semiconductor materials with respect to chemical composition, dopant concentration and crystallographic orientation. Typically, the surface semiconductor layer 10b has a thickness from about 10 to about 200 nanometers.

The semiconductor-on-insulator substrate that is illustrated in FIG. 1 may be fabricated using any of several methods. Non-limiting examples include lamination methods, layer transfer methods and separation by implantation of oxygen (SIMOX) methods.

Although this particular embodiment within the context of FIG. 1 illustrates the invention within the context of a semiconductor-on-insulator substrate comprising the base semiconductor substrate 10a, the optional buried dielectric layer 11 and the surface semiconductor layer 10b, neither the embodiment, nor the invention, is necessarily so limited. Rather, the particular embodiment that is illustrated in FIG. 1 may alternatively be practiced using a bulk semiconductor substrate (that would otherwise result from absence of the optional buried dielectric layer 11 under circumstances where the semiconductor substrate 10a and the surface semiconductor layer 10b have identical chemical composition and crystallographic orientation). The embodiment also contemplates use of a hybrid orientation (HOT) substrate that has multiple crystallographic orientations within a single semiconductor substrate.

For clarity, subsequent schematic cross-sectional diagrams illustrating this particular embodiment and the invention in general will include only a bulk semiconductor substrate 10.

FIG. 1 also shows (in cross-section) a field effect transistor structure located and formed within and upon the surface semiconductor layer 10b of the semiconductor-on-insulator substrate that comprises the base semiconductor substrate 10a, the optional buried dielectric layer 11 and the surface semiconductor layer 10b. The field effect transistor structure comprises: (1) a gate dielectric 12 located and formed upon the surface semiconductor layer 14; (2) a gate 14 located and formed upon the gate dielectric 12; (3) first spacer 16 located and formed adjoining sidewalls of the gate 14 and the gate dielectric 12; (4) second spacer 18 located and formed upon the first spacer 16; and (5) a plurality of source and drain regions 19 located and formed within the surface semiconductor layer 10b and separated by a channel region located aligned beneath the gate 14. Each of the foregoing layers and structures may comprise materials and have dimensions that are conventional in the semiconductor fabrication art. Each of the foregoing layers and structures may also be formed using methods that are conventional in the semiconductor fabrication art.

The gate dielectric 12 may comprise conventional dielectric materials such as oxides, nitrides and oxynitrides of silicon that have a dielectric constant from about 4 to about 20, measured in vacuum. Alternatively, the gate dielectric 12 may comprise generally higher dielectric constant dielectric materials having a dielectric constant from about 20 to at least about 100. Such higher dielectric constant dielectric materials may include, but are not limited to hafnium oxides, hafnium silicates, titanium oxides, barium-strontium-titantates (BSTs) and lead-zirconate-titanates (PZTs). The gate dielectric 12 may be formed using any of several methods that are appropriate to the material or materials of composition of the gate dielectric 12. Included, but not limiting, are thermal or plasma oxidation or nitridation methods, chemical vapor deposition methods and physical vapor deposition methods. Typically and preferably, the gate dielectric 12 comprises a thermal silicon oxide dielectric material that has a thickness from about 1 to about 5 nanometers.

The gate 14 may comprise materials including, but not limited to certain metals, metal alloys, metal nitrides and metal silicides, as well as laminates thereof and composites thereof. The gate 14 may also comprise doped polysilicon and doped polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically and preferably, the gate 14 comprises a doped polysilicon material that has a thickness from about 40 to about 200 nanometers.

The first spacer 16 may comprise any of several spacer materials. Dielectric spacer materials are most common. Such dielectric spacer materials may include, but are not limited to: oxides, nitrides and oxynitrides of silicon, although oxides, nitrides and oxynitrides of other elements are not excluded. The dielectric materials may be formed using any of the several methods that may be used for forming the buried dielectric layer 11. Typically, the first spacer 16 comprises a silicon nitride dielectric material that has a thickness from about 5 to about 20 nanometers.

The second spacer 18 may comprise materials including, but not limited to conductor materials and dielectric materials. Conductor spacer materials are less common, but are nonetheless known. Dielectric spacer materials are more common. The spacer materials may be formed using methods analogous, equivalent or identical to the methods that are used for forming the first spacer 16. The second spacer 18 is also formed with the distinctive inward pointing spacer shape by using a blanket layer deposition and anisotropic etchback method. Typically, the second spacer 18 comprises a silicon oxide dielectric material when the first spacer 16 comprises a silicon nitride dielectric material.

Finally, the plurality of source/drain regions 19 comprises a generally conventional conductivity dopant of polarity appropriate for a particular field effect transistor structure desired to be fabricated. As is understood by a person skilled in the art, the plurality of source/drain regions 19 is formed using a two-step ion implantation method. A first ion implantation process step within the method uses the gate 14, absent the first and second spacers 16/18 as a mask, to form a plurality of extension regions, each of which extends beneath the first and second spacers 16/18. A second ion implantation process step uses the gate 14 along with the first and second spacers 16/18 as a mask, to form the larger contact region portions of the plurality of source/drain regions 19, while simultaneously incorporating the pair of extension regions. Dopant levels are from about 1e19 to about 1e21 dopant atoms per cubic centimeter within each of the plurality of source/drain regions 19. Extension regions within the plurality of source/drain regions 19 may under certain circumstances be more lightly doped than contact regions with the plurality of source/drain regions 19, although such differential doping concentrations are not a requirement of this particular embodiment or of the invention.

Figure 2:
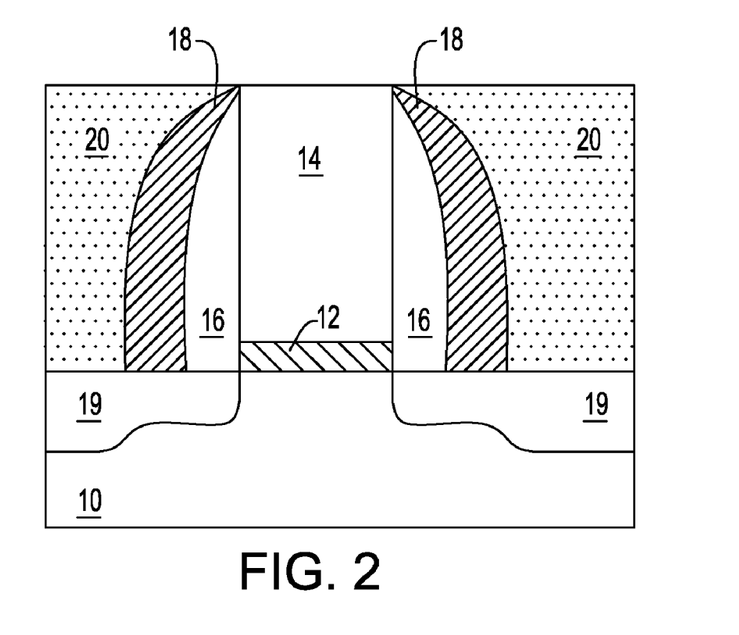

FIG. 2 shows an inter-metal dielectric 20 located and formed planarized to the level of the gate 14. The inter-level dielectric 20 may comprise any of several inter-metal dielectric materials. Included but not limiting are silicon oxide, silicon nitride and silicon oxynitride dielectric materials. The inter-metal dielectric 20 may be formed using any of several methods. Included but not limiting are chemical vapor deposition methods and physical vapor deposition methods. Typically the inter-metal dielectric 20 is located formed and planarized to a thickness from about 40 to about 200 nanometers while exposing the gate 14 and in particular while using the gate 14 as a planarizing stop.

Figure 3:
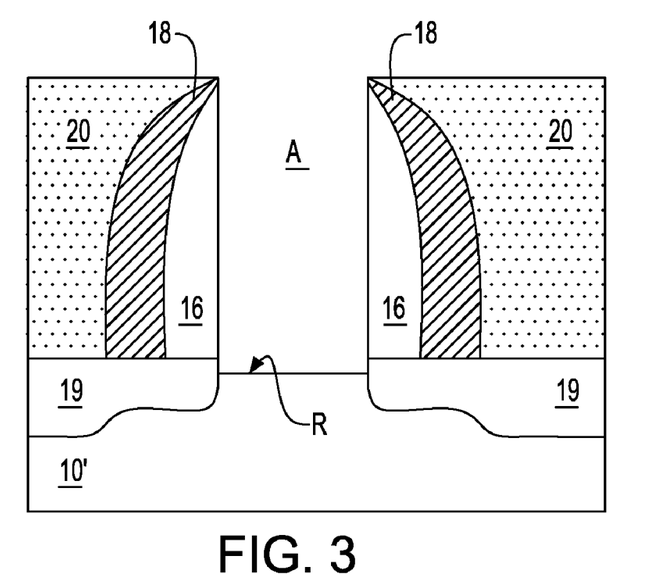

FIG. 3 shows the results of stripping the gate 14 and the gate dielectric 12 from the semiconductor structure of FIG. 2. The gate 14 and the gate dielectric 12 may be stripped from the semiconductor structure of FIG. 2 to provide in-part the semiconductor structure of FIG. 3 while using etch methods and etch materials that are otherwise generally conventional in the semiconductor fabrication art. Included in particular, but also not limiting, are wet chemical etch methods and dry plasma etch methods. Generally, chlorine containing plasma etch methods may be used for etching gate materials while fluorine containing plasma etch methods may be used for etching gate dielectric materials.

FIG. 3 also shows the results of etching a recess R into the semiconductor substrate 10 to form a semiconductor substrate 10' that includes an aperture A. The recess R may be etched into the semiconductor substrate 10 to provide the semiconductor substrate 10' while using etch methods and etch materials that are otherwise generally conventional in the semiconductor fabrication art. Also included, but also not limited are wet chemical etch methods and dry plasma etch methods.

Within the schematic cross-sectional diagram of FIG. 3, the recess R typically has a depth within the semiconductor substrate 10' from about 5 to about 15 nanometers.

Figure 4:
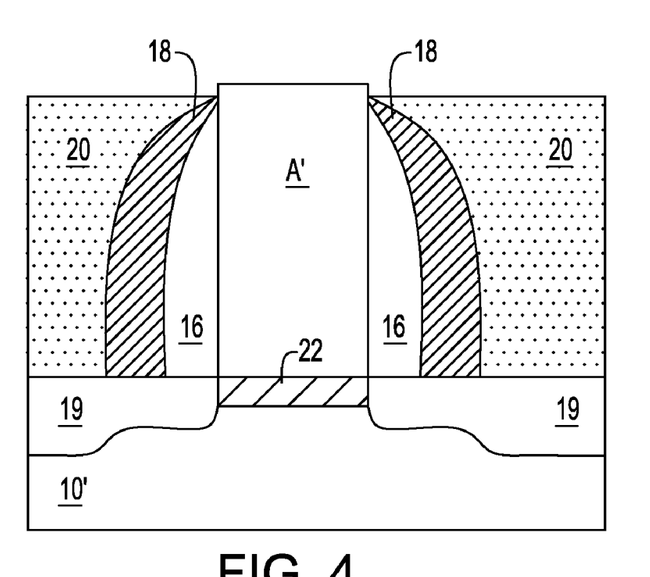

FIG. 4 shows the results of forming a germanium containing layer 22 of composition different than the semiconductor substrate 10' upon the semiconductor substrate 10' and within the recess R to form an aperture A' from the aperture A. The germanium containing layer 22 is located and formed so as to be coplanar with the upper surfaces of the source and drain regions 19 and thus the remainder of the semiconductor substrate 10'. The germanium containing layer 22 may comprise any of several germanium containing materials. Pure germanium materials and silicon-germanium alloy materials are most common. Typically the germanium containing layer 22 comprises a pure germanium material, or a silicon-germanium alloy material, that has a thickness from about 5 to about 15 nanometers.

Figure 5:
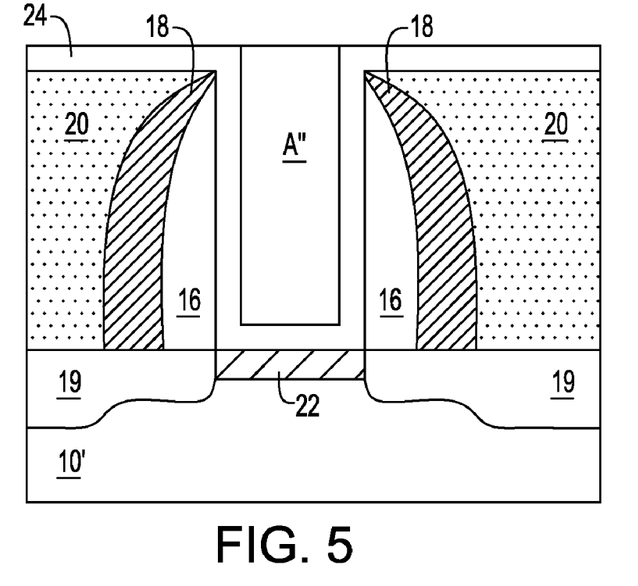

FIG. 5 shows a gate dielectric 24 located and formed incompletely filling the aperture A' that is illustrated in FIG. 4 to in turn provide an aperture A''. The gate dielectric 24 that is illustrated within the schematic cross-sectional diagram of FIG. 5 may be otherwise analogous, equivalent or identical to the gate dielectric 12 that is illustrated within the schematic cross-sectional diagram of FIG. 1. In that regard, the gate dielectric 24 may comprise either a generally conventional lower dielectric constant dielectric material having a dielectric constant less than about 20 (i.e., such as a silicon oxide dielectric material that is used in an input/output transistor) or a generally higher dielectric constant dielectric material having a dielectric constant of up to at least about 100. Typically, the gate dielectric 24 comprises a generally higher dielectric constant dielectric material that has a dielectric constant of up to about 100.

Figure 6:
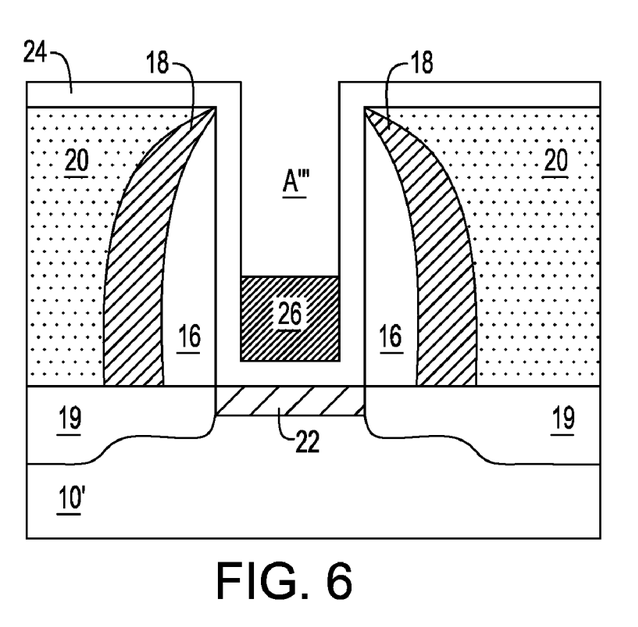

FIG. 6 shows a metal gate material layer 26 located and formed upon the gate dielectric 24 that is illustrated in FIG. 5 while still incompletely filling the aperture A'' to form an aperture A'. The metal gate material layer 26 may comprise any of several metal gate materials. Typically, the metal gate material layer 26 comprises a metal gate material with a pre-selected bandwidth that is engineered to optimize performance of a field effect transistor that results from further processing of the semiconductor structure that is illustrated in FIG. 6. Typically, the metal gate material may be selected from the group including but not limited to tantalum, titanium and tungsten metal gate materials, as well as nitrides thereof. Typically, the metal gate material layer 26 has a thickness from about 4 to about 10 nanometers.

Figure 7:
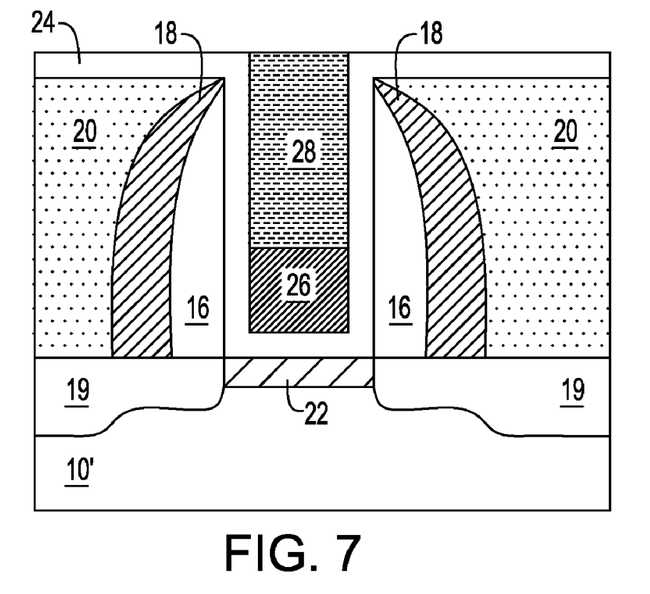

FIG. 7 shows a silicon gate material layer 28 located and formed upon the metal gate material layer 26 and completely filling the aperture A'. The silicon gate material layer 28 may comprise any of several silicon gate materials. Included in particular, but also not limited, are polysilicon gate materials and polysilicon-germanium alloy gate materials. Typically, the silicon gate material layer 28 comprises a polysilicon gate material that has a thickness from about 40 to about 200 nanometers that completely fills the aperture A' that is illustrated in FIG. 6.

Figure 8:
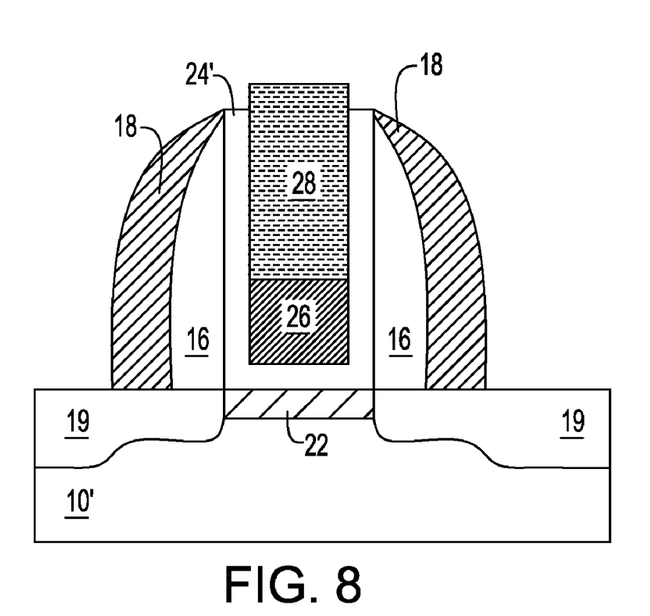

FIG. 8 first shows the results of planarizing the gate dielectric 24 to form a gate dielectric 24'. Such planarizing may be effected using methods and materials that are otherwise generally conventional in the semiconductor fabrication art. Included in particular, but also not limiting, are mechanical planarizing methods and chemical mechanical polish planarizing methods.

FIG. 8 also shows the results of subsequently stripping the inter-level dielectric 20 from the semiconductor structure of FIG. 7. The inter-level dielectric 20 may be stripped from the semiconductor structure of FIG. 7 to provide the semiconductor structure of FIG. 8 while using stripping methods and stripping materials that are otherwise generally conventional in the semiconductor fabrication art. Included in particular, but also not limiting, are wet chemical stripping methods and materials, and dry plasmas stripping methods and materials.

Figure 9:
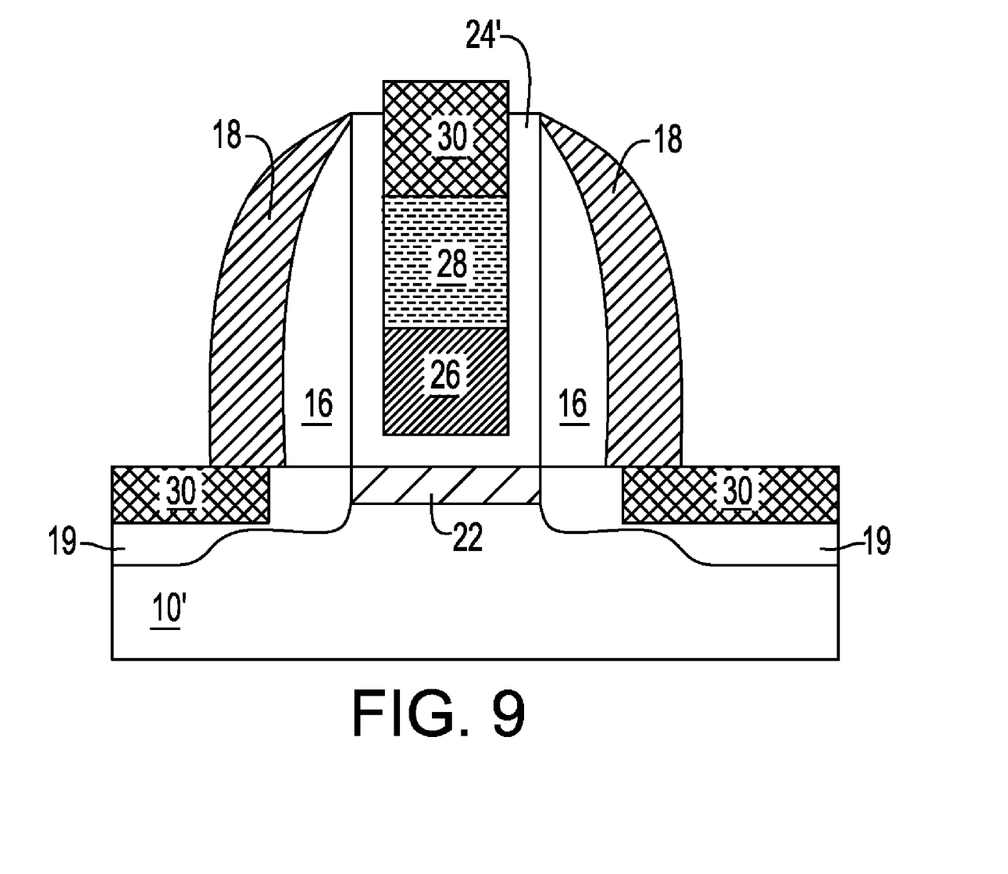

FIG. 9 finally shows silicide layers 30 located and formed upon the silicon gate material layer 28 and the source and drain regions 19. The silicide layers 30 may comprise any of several silicide forming metals. Non-limiting examples of candidate silicide forming metals include nickel, cobalt, titanium, tungsten, erbium, ytterbium, platinum and vanadium silicide forming metals. Nickel and cobalt silicide forming metals are particularly common. Others of the above enumerated silicide forming metals are less common. Typically, the silicide layers 30 are formed using a salicide method. The salicide method includes: (1) forming a blanket silicide forming metal layer upon the semiconductor structure of FIG. 8; (2) thermally annealing the blanket silicide forming metal layer with silicon surfaces which it contacts to selectively form the silicide layers 30 while leaving unreacted metal silicide forming metal layers on, for example, the second spacer 18; and (3) selectively stripping unreacted portions of the silicide forming metal layers from, for example, the second spacer 18. Typically, the silicide layers 30 comprise a nickel silicide material or a cobalt silicide material that has a thickness from about 10 to about 30 nanometers.

FIG. 9 shows a semiconductor structure in accordance with a particular preferred embodiment of the invention. The semiconductor structure comprises a field effect transistor structure that includes a germanium containing layer 22 as a channel located and formed symmetrically aligned beneath and wider than a gate 30/28/26. The germanium containing layer 22 channel is coplanar with the source and drain regions 19 and separates the source and drain regions 19. The germanium containing layer 22 comprises a germanium containing material that has a higher germanium content than the plurality of source and drain regions 19 within a semiconductor substrate within which is located the germanium containing layer 22.

Within the field effect structure of FIG. 9, the gate dielectric 24' comprises a U-shaped gate dielectric.

The preferred embodiment is illustrative of the invention rather than limiting of the invention. Revisions and modifications may be made to methods, materials, structures and dimensions of a semiconductor structure in accordance with the preferred embodiment while still providing a semiconductor structure and a method for fabrication thereof in accordance with the invention, further in accordance with the accompanying claims.

What is claimed is:
1. A semiconductor structure comprising:
   a semiconductor substrate;
   a gate aligned over a channel within the semiconductor substrate; and
   a plurality of source/drain regions separated by the channel, wherein:
      the channel is coplanar with the plurality of source/drain regions; and
      the channel comprises a germanium containing material having a germanium content greater than a germanium content of the plurality of source/drain regions and wherein said channel is located in a recessed area of said semiconductor substrate and has a topmost surface that is coplanar with a remaining topmost surface of said semiconductor substrate.

2. The semiconductor structure of claim 1 wherein the semiconductor substrate comprises a bulk semiconductor substrate.

3. The semiconductor substrate of claim 1 wherein the semiconductor substrate comprises a semiconductor-on-insulator substrate.

4. The semiconductor structure of claim 1 wherein the semiconductor substrate comprises a hybrid orientation substrate.

5. The semiconductor structure of claim 1 wherein the germanium containing material comprises pure germanium.

6. The semiconductor structure of claim 1 wherein the germanium containing material comprises a silicon-germanium alloy.

7. The semiconductor structure of claim 1 wherein the channel has a wider linewidth than the gate.

8. The semiconductor structure of claim 1 further comprising a U shaped gate dielectric interposed between the gate and the semiconductor substrate.

9. The semiconductor structure of claim 1 wherein the U shaped gate dielectric comprises a high dielectric constant dielectric material.

10. A method for fabricating a semiconductor structure comprising:
    forming a gate aligned over a channel within a semiconductor substrate;
    forming a spacer adjoining the gate;
    stripping the gate to leave remaining the spacer that exposes the semiconductor substrate;
    etching the semiconductor substrate to form a recess within the semiconductor substrate aligned with the spacer;
    forming a germanium containing channel layer within the recess; and
    forming a plurality of source/drain regions within the semiconductor substrate and separated by the channel, wherein:
       the channel is coplanar with the plurality of source/drain regions;
       the germanium containing channel layer comprises a germanium containing material having a germanium content greater than a germanium content of the plurality of source/drain regions.

11. The method of claim 10 wherein the semiconductor substrate comprises a bulk semiconductor substrate.

12. The method of claim 10 wherein the semiconductor substrate comprises a semiconductor-on-insulator substrate.

13. The method of claim 10 wherein the semiconductor substrate comprises a hybrid orientation substrate.

14. The method of claim 10 wherein the germanium containing material comprises pure germanium.

15. The method of claim 10 wherein the germanium containing material comprises a silicon-germanium alloy.

16. The method of claim 10 wherein the channel has a wider linewidth than the gate.

17. The method of claim 10 further comprising forming a gate dielectric interposed the gate and the semiconductor substrate.

18. The method of claim 17 wherein the gate dielectric has a U shape.

19. The method of claim 18 wherein the gate dielectric comprises a high dielectric constant dielectric material.

* * * * *